United States Patent
Fromel et al.

(10) Patent No.: US 9,633,667 B2
(45) Date of Patent: Apr. 25, 2017

(54) ADAPTIVE AUDIO SIGNAL FILTERING

(75) Inventors: Andreas Fromel, Kirchseeon (DE);
Jani Samuli Kuivalainen, Ulm (DE)

(73) Assignee: Nokia Technologies Oy, Espoo (FI)

( * ) Notice: Subject to any disclaimer, the term of this patent is extended or adjusted under 35 U.S.C. 154(b) by 175 days.

(21) Appl. No.: 14/388,152

(22) PCT Filed: Apr. 5, 2012

(86) PCT No.: PCT/IB2012/051689
§ 371 (c)(1),
(2), (4) Date: Dec. 30, 2014

(87) PCT Pub. No.: WO2013/150340
PCT Pub. Date: Oct. 10, 2013

(65) Prior Publication Data
US 2015/0310874 A1    Oct. 29, 2015

(51) Int. Cl.
*G10L 21/00* (2013.01)
*G10L 21/02* (2013.01)
*G10L 21/0364* (2013.01)
*G10L 25/78* (2013.01)

(52) U.S. Cl.
CPC .......... *G10L 21/02* (2013.01); *G10L 21/0364* (2013.01); *G10L 25/78* (2013.01)

(58) Field of Classification Search
CPC ..... G10L 21/02; G10L 21/0205; G10L 25/81; G10L 25/84; G10L 19/008; H04S 7/307
USPC ........................................................ 704/233
See application file for complete search history.

(56) References Cited

U.S. PATENT DOCUMENTS

| | | | |
|---|---|---|---|
| 5,878,391 A | 3/1999 | Aarts | |
| 6,098,830 A | 8/2000 | Jamieson | |
| 6,198,830 B1* | 3/2001 | Holube | H03G 7/06 381/312 |
| 9,215,538 B2 | 12/2015 | Rauhala | |
| 2007/0078645 A1 | 4/2007 | Niemisto et al. | |
| 2007/0223722 A1* | 9/2007 | Merrey | H04B 3/58 381/77 |
| 2009/0299742 A1 | 12/2009 | Toman et al. | |
| 2010/0121634 A1* | 5/2010 | Muesch | G10L 21/0205 704/224 |
| 2010/0128882 A1 | 5/2010 | Yamabe et al. | |

(Continued)

FOREIGN PATENT DOCUMENTS

| | | |
|---|---|---|
| DE | 19848491 A1 | 4/2000 |
| JP | 2009/161884 A | 7/2009 |

(Continued)

OTHER PUBLICATIONS

El-Maleh et al., "Speech/Music Discrimination for Multimedia Applications", IEEE International Conference on Acoustics, Speech, and Signal Processing, vol. 6, 2000, 4 pages.

(Continued)

*Primary Examiner* — Daniel Abebe
(74) *Attorney, Agent, or Firm* — Alston & Bird LLP

(57) ABSTRACT

An apparatus comprising: an audio signal analyzer configured to analyze an audio signal; an audio signal processor configured to signal process the audio signal to enhance the speech component of the audio signal dependent on determining the audio signal comprises speech components; and signal processing the audio signal to enhance a loudness of the audio signal otherwise.

15 Claims, 10 Drawing Sheets

(56) References Cited

U.S. PATENT DOCUMENTS

| | | | | |
|---|---|---|---|---|
| 2012/0051561 A1* | 3/2012 | Cohen | ................... | G10L 21/00 381/122 |
| 2012/0310635 A1* | 12/2012 | Muesch | ............. | G10L 21/0205 704/225 |
| 2015/0348546 A1* | 12/2015 | Sun | ....................... | G10L 21/02 704/233 |
| 2016/0071527 A1* | 3/2016 | Muesch | ............. | G10L 21/0208 704/225 |

FOREIGN PATENT DOCUMENTS

| | | |
|---|---|---|
| WO | 2008106036 | 9/2008 |
| WO | 2009011827 | 1/2009 |
| WO | 2010033384 | 3/2010 |
| WO | 2010071521 | 6/2010 |
| WO | WO-2010/128882 A1 | 11/2010 |
| WO | 2011/015237 A1 | 2/2011 |
| WO | 2012127278 | 9/2012 |

OTHER PUBLICATIONS

Munoz-Exposito et al., "New Speech/Music Discrimination Approach Based on Warping Transformation and ANFIS", Journal of New Music Research, vol. 35, No. 3, 2006, pp. 237-247.

Panagiotakis et al., "A Speech/Music Discriminator Based on RMS and Zero-Crossings", IEEE Transactions on Multimedia, vol. 7, Issue: 1, Feb. 2005, pp. 155-166.

Song et al., "Discrimination of Music Signals for Mobile Broadcasting Receivers", AES 34th International Conference, Aug. 28-30, 2008, pp. 1-3.

International Search Report and Written Opinion received for corresponding Patent Cooperation Treaty Application No. PCT/IB2012/051689, mailed Mar. 26, 2013, 15 pages.

Extended European Search Report received for corresponding European Patent Application No. 12873637.8, dated Sep. 29, 2015, 7 pages.

* cited by examiner

ADAPTIVE AUDIO SIGNAL FILTERING

RELATED APPLICATION

This application was originally filed as PCT Application No. PCT/IB2012/051689 filed Apr. 5, 2012.

FIELD

The present application relates to adaptive audio processing, and in particular, but not exclusively to an adaptive audio processing for use in portable apparatus.

BACKGROUND

The use of electro-dynamic loudspeakers or earpiece units in apparatus is common. Most electronic devices contain an electro dynamic loudspeaker or transducer configured to convert electrical signals into acoustic waves to be output and heard by the user of the apparatus. For example mobile or similar telephones can contain an integrated transducer sometimes called an integrated handsfree (IHF) transducer configured to operate as an earpiece for speech and also as a loudspeaker for hands free and audio signal playback.

SUMMARY

Embodiments attempt to address the above problem.

There is provided according to a first aspect a method comprising: analysing an audio signal comprises speech components; signal processing the audio signal using a first one or more parameter to enhance the speech component of the audio signal dependent on determining the audio signal comprises speech components; and signal processing the audio signal using a second one or more parameter to enhance the audio signal otherwise.

Signal processing the audio signal to enhance the speech component of the audio signal using a first one or more parameter dependent on determining the audio signal comprises speech components may comprise: filtering the audio signal into at least two bands; performing a dynamic range control processing on the at least two bands according to the first one or more parameter, the first one or more parameter being a first set of dynamic range control settings so to enhance an intelligibility of the speech component of the audio signal; and combining the dynamic range control processed bands into an output audio signal.

Performing a dynamic range control processing on the at least two bands may comprise compressing a mid-band frequency range compared to the higher-band frequency range.

Signal processing the audio signal using a first one or more parameter to enhance the speech component of the audio signal dependent on determining the audio signal comprises speech components may comprise at least one of: equalising the audio signal to enhance an intelligibility of the speech component of the audio signal; and filtering the audio signal to enhance an intelligibility of the speech component of the audio signal.

Signal processing the audio signal using the second one or more parameter to enhance the audio signal may comprise: filtering audio signal into at least two bands; performing a dynamic range control processing on the audio signal at least two bands according to the second one or more parameter, the second one or more parameter being a second set of dynamic range control settings so to enhance a loudness of the audio signal; and combining the dynamic range control processed bands into an output audio signal.

Performing a dynamic range control processing on the audio signal at least two bands according to a second set of dynamic range control settings may comprise compressing a higher-band frequency range compared to the mid-band frequency range.

Signal processing the audio signal using the second one or more parameter to enhance the loudness of the audio signal may comprise at least one of: equalising the audio signal using the second one or more parameter to enhance the loudness of the audio signal; and filtering the audio signal using the second one or more parameter to enhance the loudness of the audio signal.

The mid-band frequency range may be 700 Hz and 4 kHz and the higher-band frequency range may be greater than 4 kHz.

Analysing the audio signal may comprise: determining a speech indicator in metadata associated with the audio signal; and determining voice activity in the audio signal.

According to a second aspect there is provided an apparatus comprising at least one processor and at least one memory including computer code for one or more programs, the at least one memory and the computer code configured to with the at least one processor cause the apparatus to at least perform: analysing an audio signal comprises speech components; signal processing the audio signal using a first one or more parameter to enhance the speech component of the audio signal dependent on determining the audio signal comprises speech components; and signal processing the audio signal using a second one or more parameter to enhance the audio signal otherwise.

Signal processing the audio signal using a first one or more parameter to enhance the speech component of the audio signal dependent on determining the audio signal comprises speech components may cause the apparatus to perform: filtering the audio signal into at least two bands; performing a dynamic range control processing on the at least two bands according to the first one or more parameters, the first one or more parameters being a first set of dynamic range control settings so to enhance an intelligibility of the speech component of the audio signal; and combining the dynamic range control processed bands into an output audio signal.

Performing a dynamic range control processing on the at least two bands may cause the apparatus to perform compressing a mid-band frequency range compared to the higher-band frequency range.

Signal processing the audio signal using a first one or more parameter to enhance the speech component of the audio signal dependent on determining the audio signal comprises speech components may cause the apparatus to perform at least one of; equalising the audio signal to enhance an intelligibility of the speech component of the audio signal; and filtering the audio signal to enhance an intelligibility of the speech component of the audio signal.

Signal processing the audio signal using the second one or more parameter to enhance the audio signal may cause the apparatus to perform: filtering audio signal into at least two bands; performing a dynamic range control processing on the audio signal at least two bands according to the second one or more parameter, the second one or more parameter being a second set of dynamic range control settings so to enhance a loudness of the audio signal; and combining the dynamic range control processed bands into an output audio signal.

Performing a dynamic range control processing on the audio signal at least two bands according to a second set of dynamic range control settings may cause the apparatus to perform compressing a higher-band frequency range compared to the mid-band frequency range.

Signal processing the audio signal to enhance the loudness of the audio signal may cause the apparatus to perform at least one of: equalising the audio signal using the second one or more parameter to enhance the loudness of the audio signal; and filtering the audio signal using the second one or more parameter to enhance the loudness of the audio signal.

The mid-band frequency range may be 700 Hz and 4 kHz and the higher-band frequency range may be greater than 4 kHz.

Analysing the audio signal may cause the apparatus to perform: determining a speech indicator in metadata associated with the audio signal; and determining voice activity in the audio signal.

According to a third aspect there is provided an apparatus comprising: an audio signal analyser configured to analyse an audio signal; an audio signal processor configured to signal process the audio signal using a first one or more parameter to enhance the speech component of the audio signal dependent on determining the audio signal comprises speech components; and signal processing the audio signal using a second one or more parameter to enhance the audio signal otherwise.

The audio signal processor may comprise: a filter configured to filter the audio signal into at least two bands; at least one dynamic range controller configured to dynamic range control the at least two bands according to the first one or more parameter, the first one or more parameter being a first set of dynamic range control settings so to enhance an intelligibility of the speech component of the audio signal; and a combiner configured to combine the dynamic range control processed bands into an output audio signal.

The dynamic range controller may be configured to compress a mid-band frequency range compared to the higher-band frequency range.

The audio signal processor may comprise at least one of: an equaliser configured to equalise the audio signal to enhance an intelligibility of the speech component of the audio signal; and a filter configured to filter the audio signal to enhance an intelligibility of the speech component of the audio signal.

The audio signal processor may comprise: a filter configured to filter audio signal into at least two bands; at least one dynamic range controller configured to dynamic range control the audio signal at least two bands according to the second one or more parameter, the second one or more parameter being a second set of dynamic range control settings so to enhance a loudness of the audio signal; and a combiner configured to combine the dynamic range control processed bands into an output audio signal.

The dynamic range controller may be configured to compress a higher-band frequency range compared to the mid-band frequency range.

The audio signal processor may comprise at least one of: an equaliser using the second one or more parameter configured to equalise the audio signal to enhance the loudness of the audio signal; and a filter using the second one or more parameter configured to filter the audio signal to enhance the loudness of the audio signal.

The mid-band frequency range may be 700 Hz and 4 kHz and the higher-band frequency range may be greater than 4 kHz.

The audio signal analyser may comprise: a speech indicator determiner configured to determine a speech indicator in metadata associated with the audio signal; and a voice activity determiner configured to determine voice activity in the audio signal.

According to a fourth aspect there is provided an apparatus comprising: means for analysing an audio signal; means for signal processing using a first one or more parameter the audio signal to enhance the speech component of the audio signal dependent on determining the audio signal comprises speech components; and means for signal processing the audio signal using a second one or more parameter to enhance the audio signal otherwise.

The means for signal processing the audio signal using a first one or more parameter to enhance the speech component of the audio signal dependent on determining the audio signal comprises speech components may comprise: means for filtering the audio signal into at least two bands; means for performing a dynamic range control processing on the at least two bands according to the first one or more parameter, the first one or more parameter being a first set of dynamic range control settings so to enhance an intelligibility of the speech component of the audio signal; and means for combining the dynamic range control processed bands into an output audio signal.

The means for performing a dynamic range control processing on the at least two bands may comprise means for compressing a mid-band frequency range compared to the higher-band frequency range.

The means for signal processing the audio signal using a first one or more parameter to enhance the speech component of the audio signal dependent on determining the audio signal comprises speech components may comprise at least one of: means for equalising the audio signal using a first one or more parameter to enhance an intelligibility of the speech component of the audio signal; and means for filtering the audio signal using a first one or more parameter to enhance an intelligibility of the speech component of the audio signal.

The means for signal processing the audio signal using the second one or more parameter to enhance the audio signal may comprise: means for filtering audio signal into at least two bands; means for performing a dynamic range control processing on the audio signal at least two bands according to the second one or more parameter, the second one or more parameter being a second set of dynamic range control settings so to enhance a loudness of the audio signal; and means for combining the dynamic range control processed bands into an output audio signal.

The means for performing a dynamic range control processing on the audio signal at least two bands according to a second set of dynamic range control settings may comprise means for compressing a higher-band frequency range compared to the mid-band frequency range.

The means for signal processing the audio signal using the second one or more parameter to enhance the audio signal may comprise at least one of: means for equalising the audio signal using the second one or more parameter to enhance the loudness of the audio signal; and means for filtering the audio signal using the second one or more parameter to enhance the loudness of the audio signal.

The mid-band frequency range may be 700 Hz and 4 kHz and the higher-band frequency range may be greater than 4 kHz.

The means for analysing an audio signal may comprise: means for determining a speech indicator in metadata associated with the audio signal; and means for determining voice activity in the audio signal.

An electronic device may comprise apparatus as described above.

A chipset may comprise apparatus as described above.

BRIEF DESCRIPTION OF DRAWINGS

For better understanding of the present invention, reference will now be made by way of example to the accompanying drawings in which.

DESCRIPTION OF SOME EMBODIMENTS OF THE APPLICATION

Figure 1:
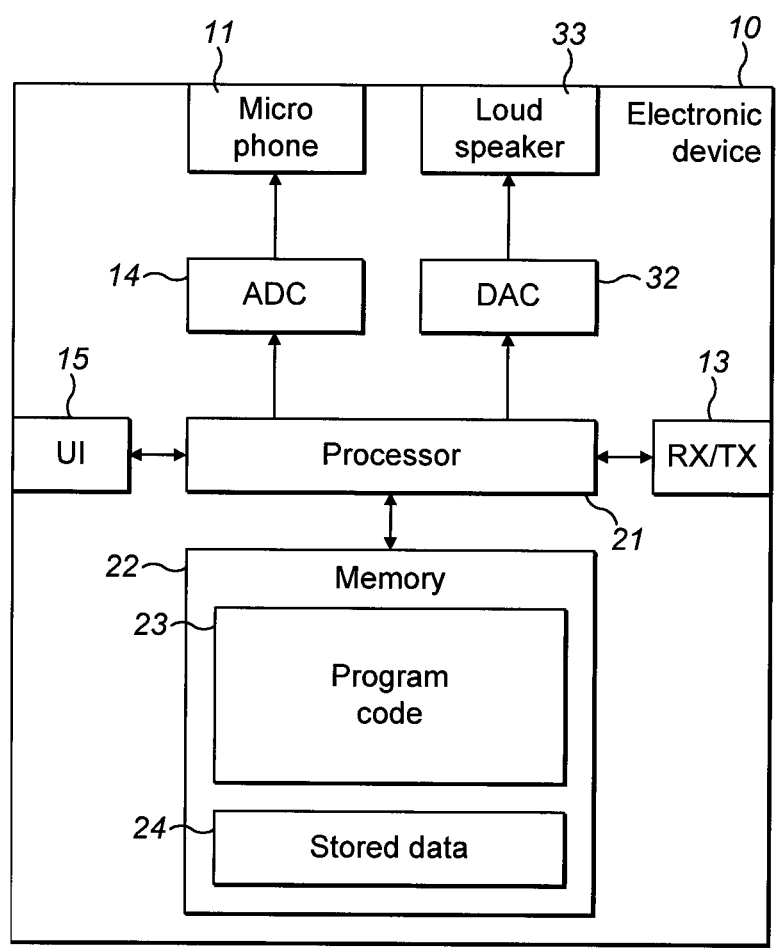
FIG. 1 shows schematically an electronic device employing some embodiments of the application.

The following describes in more detail possible adaptive audio signal processing for use in speech or speech like audio for the provision of higher quality voice communication. In this regard reference is first made to FIG. 1 which shows a schematic block diagram of an exemplary electronic device or apparatus 10, which may incorporate an adaptive speech enhancement signal processing apparatus according to embodiments of the application.

The apparatus 10 may for example, as described herein be a mobile terminal or user equipment of a wireless communication system. In other embodiments the apparatus 10 may be an audio-video device such as video camera, a Television (TV) receiver, audio recorder or audio player such as a mp3 recorder/player, a media recorder (also known as a mp4 recorder/player), or any computer suitable for the processing of audio signals.

The electronic device or apparatus 10 in some embodiments comprises a microphone 11, which is linked via an analogue-to-digital converter (ADC) 14 to a processor 21. The processor 21 is further linked via a digital-to-analogue (DAC) converter 32 to loudspeakers 33. The processor 21 is further linked to a transceiver (RX/TX) 13, to a user interface (UI) 15 and to a memory 22.

In some embodiments the apparatus 10 comprises a processor 21. Furthermore in some embodiments the apparatus 10 comprises a memory 22, and further a data storage section 24 and program code section 23. The processor 21 can in some embodiments be configured to execute various program codes. The implemented program codes in some embodiments comprise adaptive speech enhancement signal processing code as described herein. The implemented program codes 23 can in some embodiments be stored for example in the memory 22 for retrieval by the processor 21 whenever needed. The memory 22 could further provide a section 24 for storing data, for example data that has been encoded in accordance with the application.

The adaptive speech enhancement signal processing code in some embodiments can be implemented in hardware or firmware.

In some embodiments the apparatus 10 comprises a user interface 15. The user interface 15 enables a user to input commands to the electronic device 10, for example via a keypad, and/or to obtain information from the electronic device 10, for example via a display. In some embodiments a touch screen may provide both input and output functions for the user interface. The apparatus 10 in some embodiments comprises a transceiver 13 suitable for enabling communication with other apparatus, for example via a wireless communication network.

A user of the apparatus 10 for example can use the microphone 11 for inputting speech or other audio signals that are to be transmitted to some other apparatus or that are to be stored in the data section 24 of the memory 22.

The analogue-to-digital converter (ADC) 14 in some embodiments converts the input analogue audio signal into a digital audio signal and provides the digital audio signal to the processor 21. In some embodiments the microphone 11 can comprise an integrated microphone and ADC function and provide digital audio signals directly to the processor for processing.

The processor 21 in such embodiments then processes the digital audio signal according to any suitable encoding process, for example a suitable adaptable multi-rate (AMR) coding or codec.

The resulting bit stream can in some embodiments be provided to the transceiver 13 for transmission to another apparatus. Alternatively, the coded audio data in some embodiments can be stored in the data section 24 of the memory 22, for instance for a later transmission or for a later presentation by the same apparatus 10.

The apparatus 10 in some embodiments can also receive a bit stream with correspondingly encoded data from another apparatus via the transceiver 13. In this example, the processor 21 may execute decoding program code stored in the memory 22. The processor 21 in such embodiments decodes the received data. Furthermore the processor 21 in some embodiments can be configured to apply adaptive speech enhancement audio signal processing as described herein, and provide the signal output to a digital-to-analogue converter 32. The digital-to-analogue converter 32 converts the signal into analogue audio data and can in some embodiments output the analogue audio via the loudspeakers 33. Execution of the decoding and speech enhancement adaptive audio processing program code in some embodiments can be triggered by an application called by the user via the user interface 15.

The received encoded data in some embodiments can also be stored instead of an immediate presentation via the loudspeakers 33 in the data section 24 of the memory 22, for instance for later decoding, speech enhancement adaptive audio signal processing and presentation or decoding and forwarding to still another apparatus.

It is to be understood again that the structure of the apparatus 10 could be supplemented and varied in many ways.

Figure 3A:
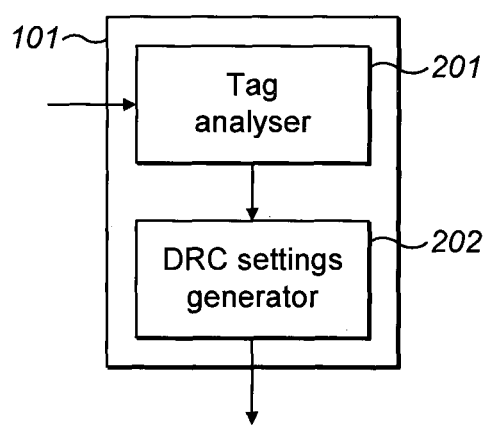
FIG. 3a shows schematically an example of an audio signal analyser as shown in FIG. 2 in further detail according to some embodiments.
Figure 3B:
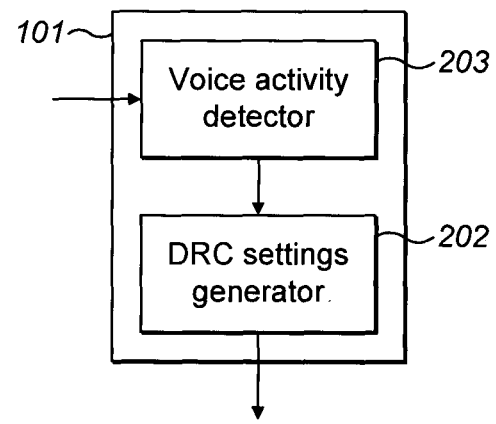
FIG. 3b shows schematically a further example of the audio signal analyser as shown in FIG. 2 in further detail according to some embodiments.
Figure 4:
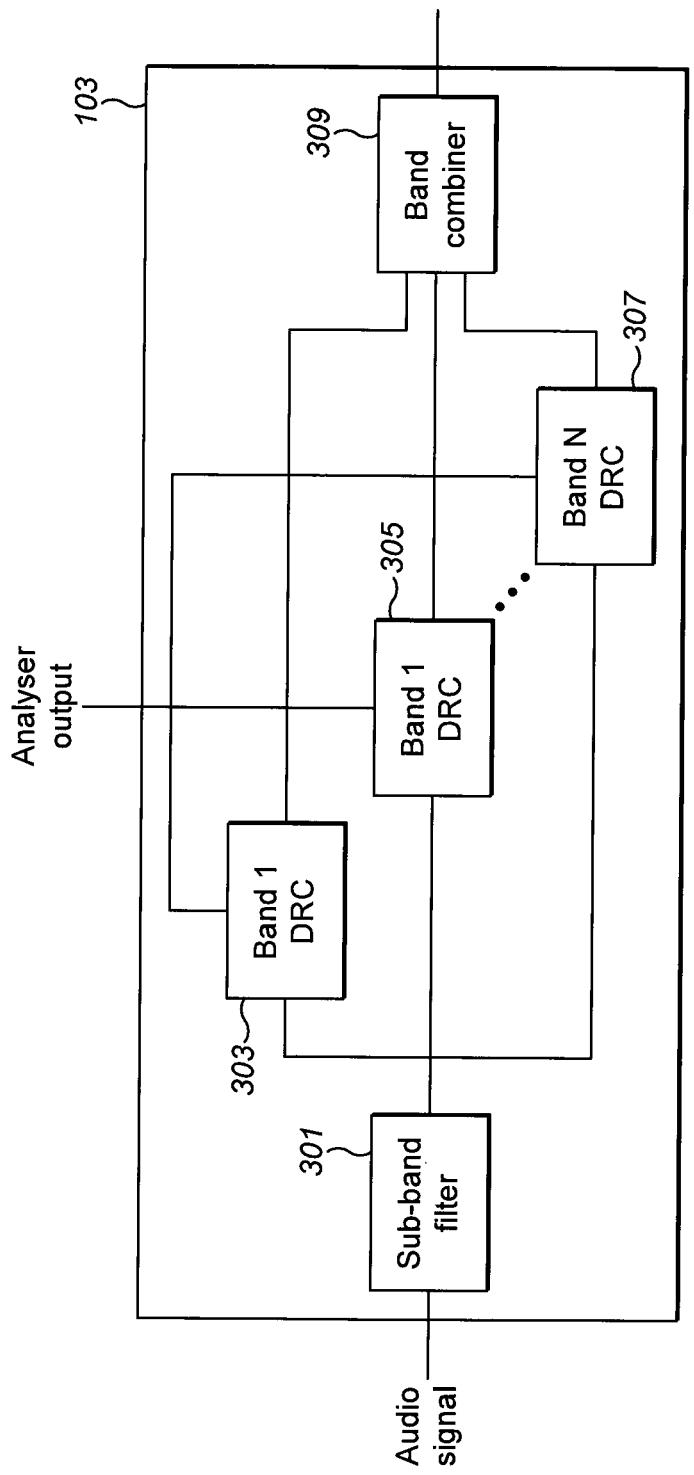
FIG. 4 shows schematically the dynamic range controller as shown in FIG. 2 in further detail according to some embodiments.
Figure 5:
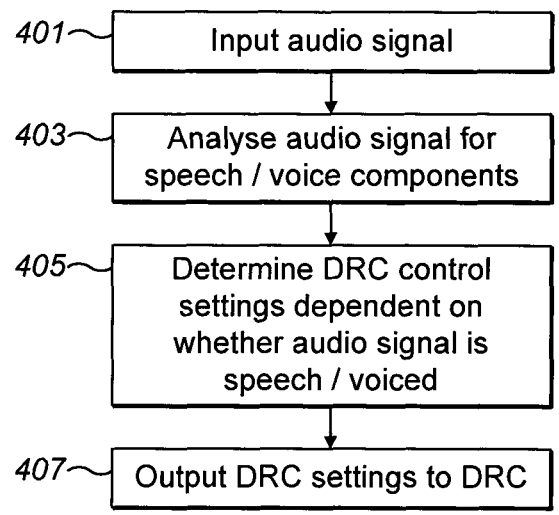
FIG. 5 shows schematically the operation of the audio signal analyser as shown in FIGS. 2, 3a and 3b according to some embodiments.
Figure 6:
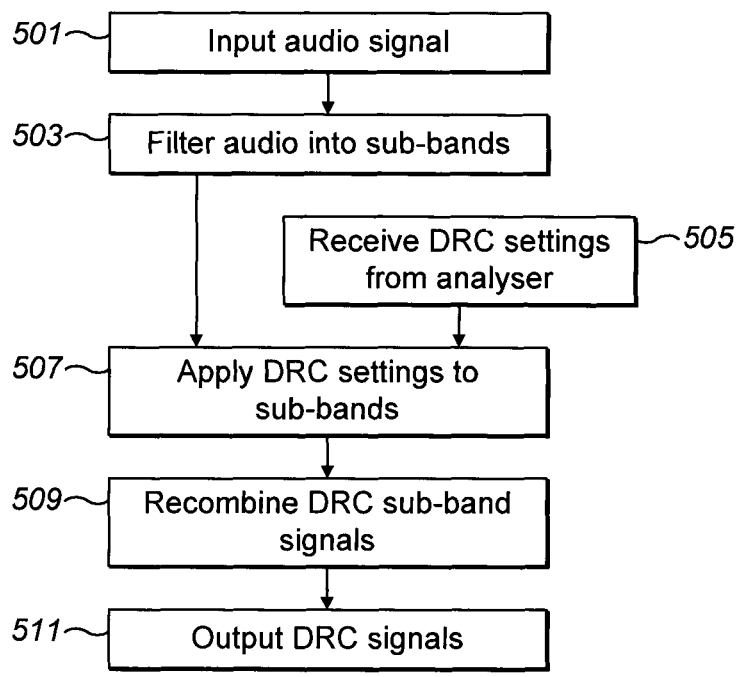
FIG. 6 shows schematically the operation of the dynamic range controller as shown in FIGS. 2 and 4 according to some embodiments.

It would be appreciated that the schematic structures described in FIGS. 2, 3a, 3b, and 4 and the method steps shown in FIGS. 5 and 6 represent only a part of the operation of audio signal playback apparatus and specifically adaptive audio signal processing apparatus or methods as exemplarily shown implemented in the apparatus shown in FIG. 1.

The concept of the application is to improve the intelligibility of mobile phone speech or audio signal speech in general by implementing speech enhancement adaptive audio signal processing.

In particular the concept of the application is to improve the performance of loud speakers and transducers outputting speech audio signals. It is understood that the structure of audio signals containing speech is different from the audio signals containing music. The dynamics of speech are higher than typically found in music. Furthermore some parts of the audio spectrum for speech are not necessary in order to make the speech audio signal understandable. Music however requires a wider bandwidth in order to sound pleasant to the users ear.

Typically an electronic apparatus or device can have an audio output device which attempts to maximise the loudspeaker output for music or speech or attempts to find a compromise between the outputs. In the embodiments described herein an analyser attempts to analyse and recognise speech in an audio signal and therefore determine whether the audio signal contains speech (or for example is music). Depending on the analysis speech enhancement can be performed. In the following examples audio signal processing dynamic range control (DRC) tuning is described. In such embodiments the analyser can be configured to determine DRC settings which produce more efficient output of the audio signal. It would be understood that although the embodiments describe herein discuss speech enhancement audio signal processing dynamic range control it would be understood that in some embodiments speech adaptive equaliser or filters can be also implemented.

Figure 2:
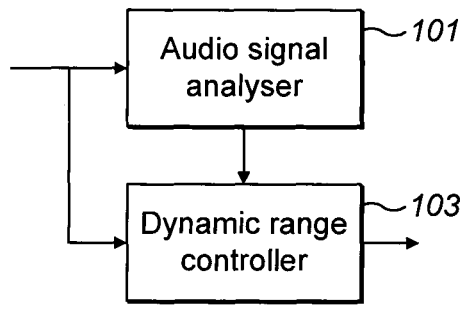
FIG. 2 shows schematically an audio signal processor according to some embodiments.

With respect to FIG. 2 the overview of the audio signal processor according to some embodiments is shown. In some embodiments the audio signal processor comprises an audio signal analyser 101. The audio signal analyser 101 is configured to receive the audio signal and analyse the audio signal to determine whether or not the audio signal is speech or non-speech (such as music) based. In some embodiments the audio signal analyser 101 can output a set of parameters to control the speech enhanced audio signal processing of the audio signal. Furthermore in some embodiments the audio signal analyser 101 outputs the analysis result to the speech enhanced audio signal processor to be used to set the parameters within the speech enhanced audio processor.

In some embodiments the audio signal analyser 101 outputs the results to a dynamic range controller 103.

In some embodiments the audio enhanced speech signal processor comprises a dynamic range controller 103. The dynamic range controller 103 can be configured to receive the audio signal and also the output of the audio signal analyser 101. The dynamic range controller 103 can be configured to adaptively change the dynamic range controller processing of the audio signal dependent on the output of the audio signal analyser 101.

The dynamic range controller 103 can then output the processed audio signal to more efficiently drive the transducer.

With respect to FIGS. 3a and 3b examples of the audio signal analyser 101 are shown in further detail. Furthermore with respect to FIG. 5 the operation of the audio signal analyser 101 as shown in FIGS. 3a and 3b are shown in further detail according to some embodiments.

In some embodiments as shown in FIG. 3a the audio signal analyser 101 comprises a tag analyser 201. The tag analyser 201 is configured to receive the audio signal to determine whether there is a music or speech tag associated with the audio signal.

The operation of inputting the audio signal to the speech analyser is shown in FIG. 5 by step 401.

In some embodiments the audio signal is associated with metadata containing tag or characteristic values identifying the audio as being speech or otherwise (such as music) in nature. In some embodiments the audio signal analyser 101 receives the metadata but not the audio signal to be analysed by the tag analyser 201.

The tag analyser 201 can be configured to output the analysis of whether the input audio signal is music or speech audio to the DRC settings generator 202.

The operation of analysing the audio signals for speech components is shown in FIG. 5 by step 403.

As shown in FIG. 3b the audio signal analyser 101 can comprise a voice activity detector (VAD) 203. The voice activity detector 203 can be any suitable voice activity detector configured to determine speech signals.

The audio signal analyser, in some embodiments as shown in both FIGS. 3a and 3b, comprises a dynamic range controller (DRC) settings generator 202. The DRC settings generator 202 is configured to receive the output of the tag analyser 201, (or voice activity detector 203), or any other suitable speech detection analysis output and generate a set of dynamic range controller settings suitable for applying to the dynamic range controller 103 dependent on the output of whether the audio signal is speech or non-speech (such as music).

Figure 7:
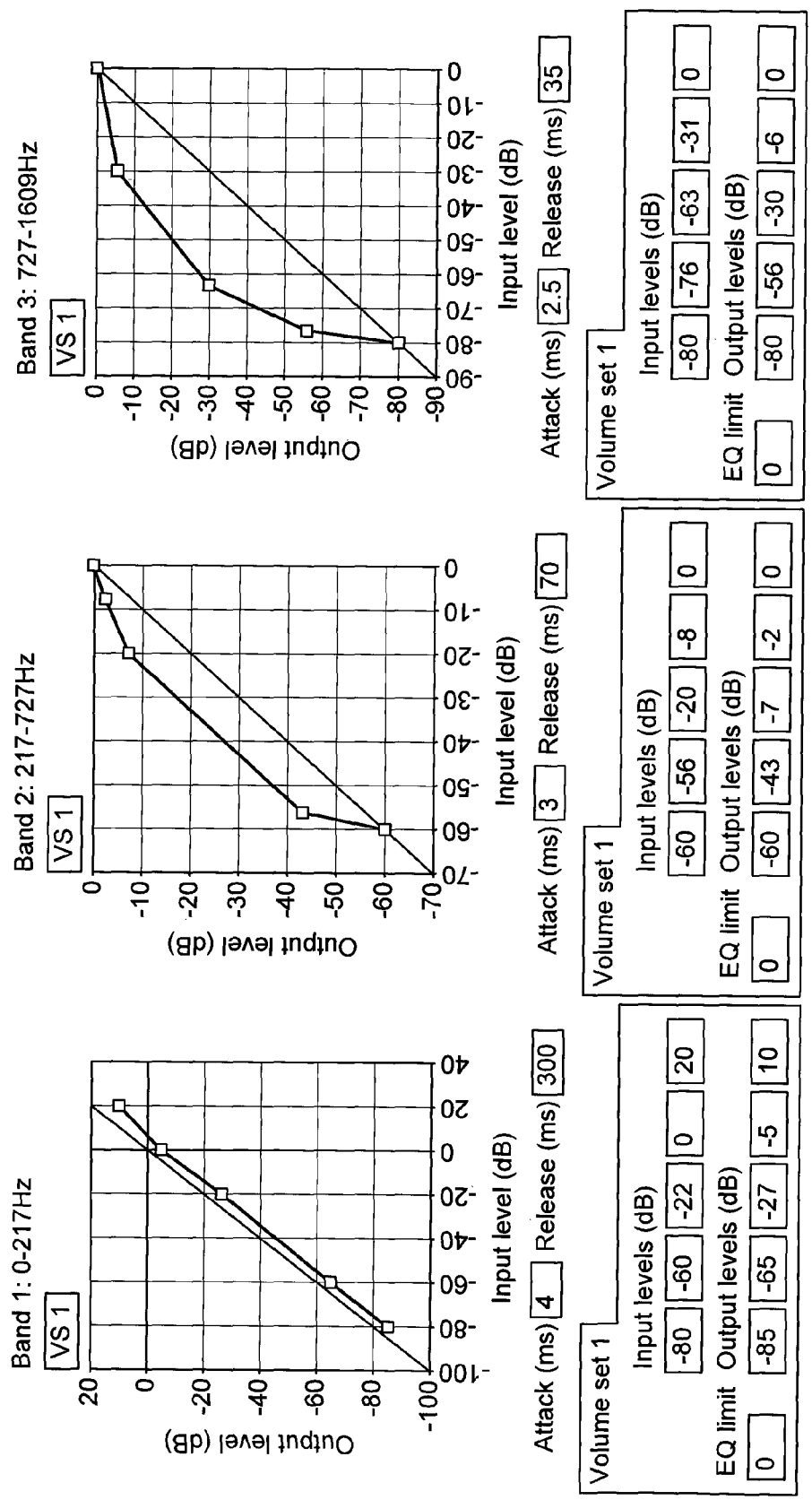
FIG. 7 shows an example of the dynamic range controller input to output settings for example frequency bands for speech or voice audio signals according to some embodiments.
Figure 7:
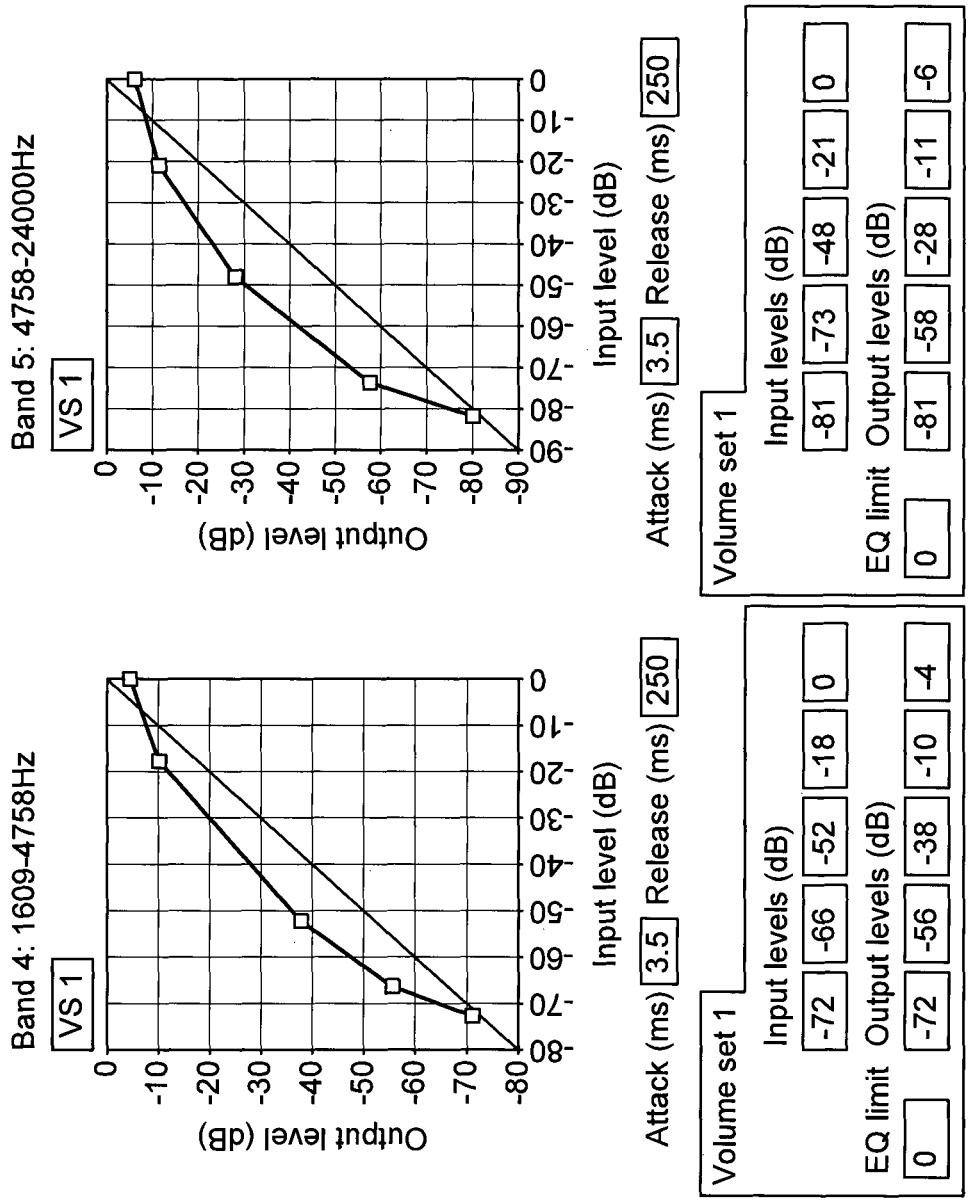
Figure 8:
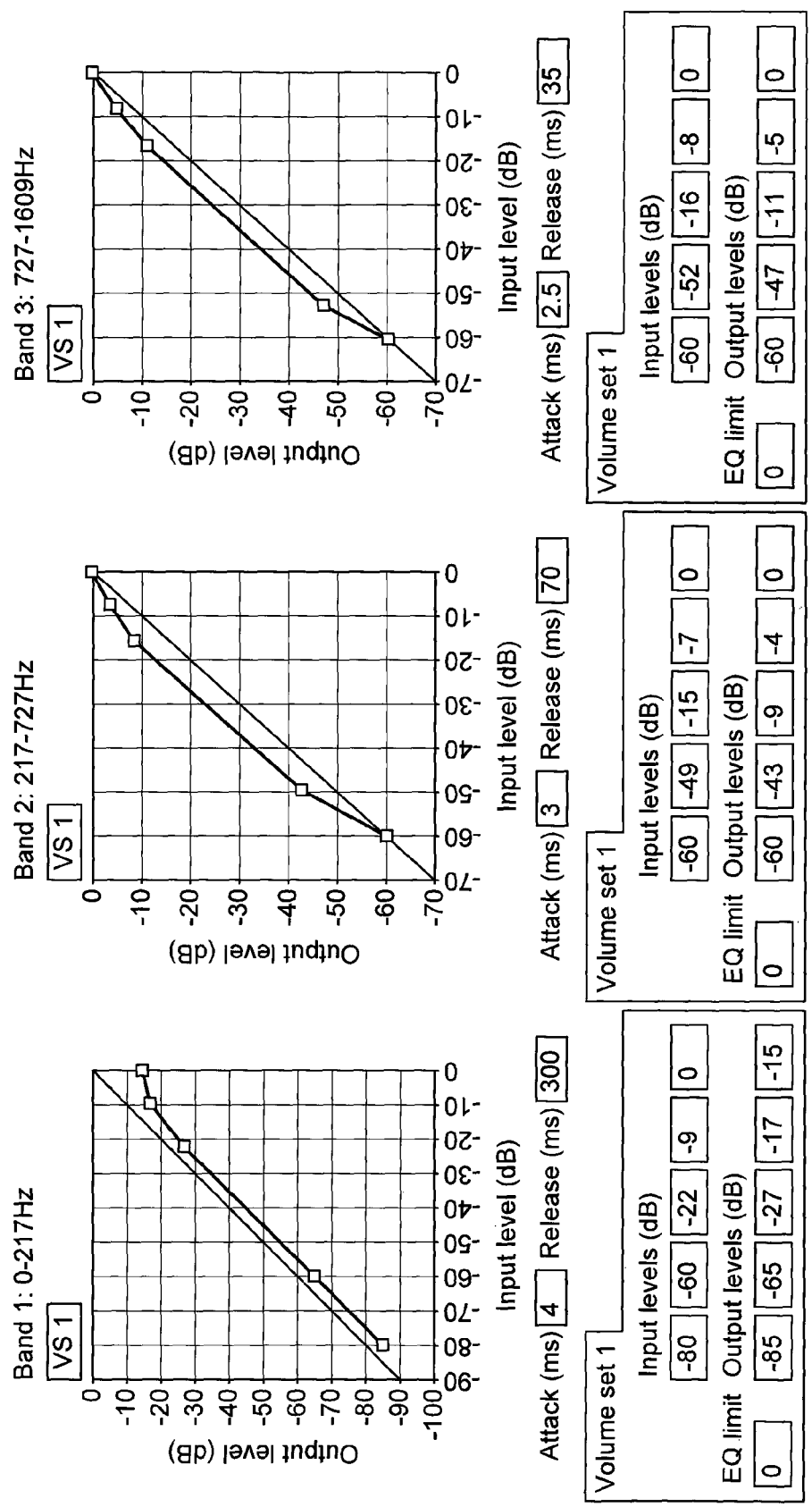
FIG. 8 shows an example of the dynamic range controller input to output settings for example frequency bands for music audio signals according to some embodiments.
Figure 8:
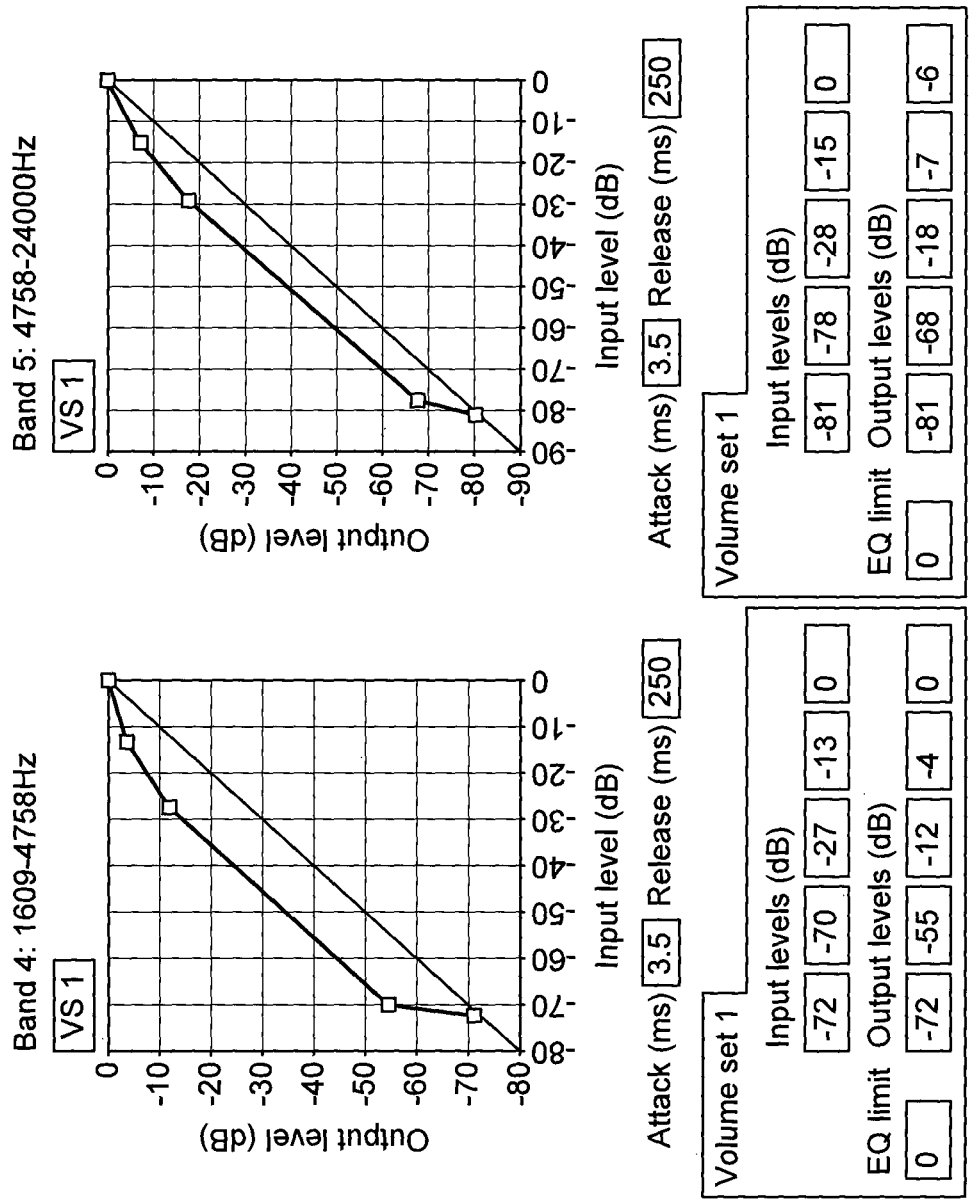

With respect to FIG. 7 an example set of dynamic range controller settings are shown for speech tuning are shown. In the example shown in FIG. 7 there are a set of dynamic range control settings for various frequency bands which are passed to the dynamic range controller and applied to each of the bands. With respect to FIG. 8 dynamic range control settings are shown for similar bands but where the audio signal is determined to be non-speech (for example music). The examples shown in FIGS. 7 and 8 show that in some embodiments for a speech audio signal the dynamic range controller settings compress much more the mid-range between 700 Hz and 4 kHz whereas for music only the higher frequencies are compressed. In other words for low levels of signal there is a much higher compression factor. The impact of which when applied would enhance speech components within audio signals with speech components but enhance the loudness of the audio signal otherwise.

With respect to FIG. 5 the operation of determining the DRC control settings dependent on whether the audio signal is speech (or voice) is shown in step 405.

Furthermore the DRC settings generator 202 can output the settings to the dynamic range controller 103. The outputting of DRC settings to the DRC is shown in FIG. 5 by step 407.

With respect to FIG. 4 the dynamic range controller 103 according to some embodiments is shown in further detail. Furthermore with respect to FIG. 6 the operation of the dynamic range controller 103 is described.

The dynamic range controller 103 can in some embodiments receive the input audio signal.

The inputting of the audio signal is shown in FIG. 6 by step 501.

The dynamic range controller 103 in some embodiments can comprise a sub-band filter 301 configured to filter the input audio signal into a determined number of sub-bands. The sub-bands can be contiguous or overlapping and be linear or non-linear in distribution or frequency range depending on the implementation embodiment. In the following examples the sub-band filter 301 can be configured to generate 5 sub-bands for the audio signal, band 1 from 0-217 Hz, band 2 from 217-727 Hz, band 3 from 727-1609 Hz, band 4 from 1609-4758 Hz, and band 5 from 4758-24000 Hz. The sub-band filter can perform such filtering according to any suitable means.

The sub-band filter 301 can be configured to output each of the sub-bands to an associated band dynamic range controller. Thus in the embodiments as shown in FIG. 4 the first band, band 1, is passed to the band 1 DRC 303, the second band, band 2, is to passed to the band 2 DRC 305 and the fifth band, band 5, passed to the band N DRC 307. It would be understood that in some embodiments the number of sub-bands can be greater than or less than 5 (as represented by the value N).

The operation of filtering the audio into sub-bands is shown in FIG. 6 by step 503.

In some embodiments the dynamic range controller 103 comprises a series of band dynamic range controllers. In the example shown in FIG. 4 there is a band 1 dynamic range controller 303 configured to receive the band 1 sub-band audio signal and the band 1 dynamic range control settings from the analyser output, a band 2 dynamic range controller 305 configured to receive the second band audio signals from the sub-band filter 301 and the dynamic range controller settings from the analyser output for the second band, and a band N dynamic range controller 307, where N=5 in this example, dynamic range controller configured to receive the fifth band sub-band audio signal from the sub-band filter 301 and the fifth band dynamic range controller settings from the analyser output.

The operation of receiving the dynamic range controller settings from the analyser is shown in FIG. 6 by step 505.

Each of the band dynamic range controllers 303, 305 and 307 can be configured to receive the audio signal of the sub-band and apply the dynamic range control settings to each band to generate a dynamically range controlled band output signal. The dynamically range controlled band output signals can be passed to a band combiner 309.

The operation of applying the dynamic range control settings to each of the sub-bands is shown in FIG. 6 by step 507.

In some embodiments the dynamic range controller 103 comprises a band combiner 309. The band combiner 309 can be configured to recombine the received band dynamically controlled signals to a single audio signal.

The combination of the dynamically range control band signals into a single audio signal is shown in FIG. 6 by step 509.

Furthermore the band combiner 309 can be configured to output the dynamically range controlled band combined signals.

The operation of outputting the DRC signals is shown in FIG. 6 by step 511.

In some embodiments the combiner can be configured to apply interpolation on the audio signals such that where tuning sets are changed there is no sudden change when the dynamic range controller switches between speech and non-speech audio signals. In some embodiments this dynamic switching DRC fading can be implemented within the band DRC components or in the DRC control settings components.

Figure 9:
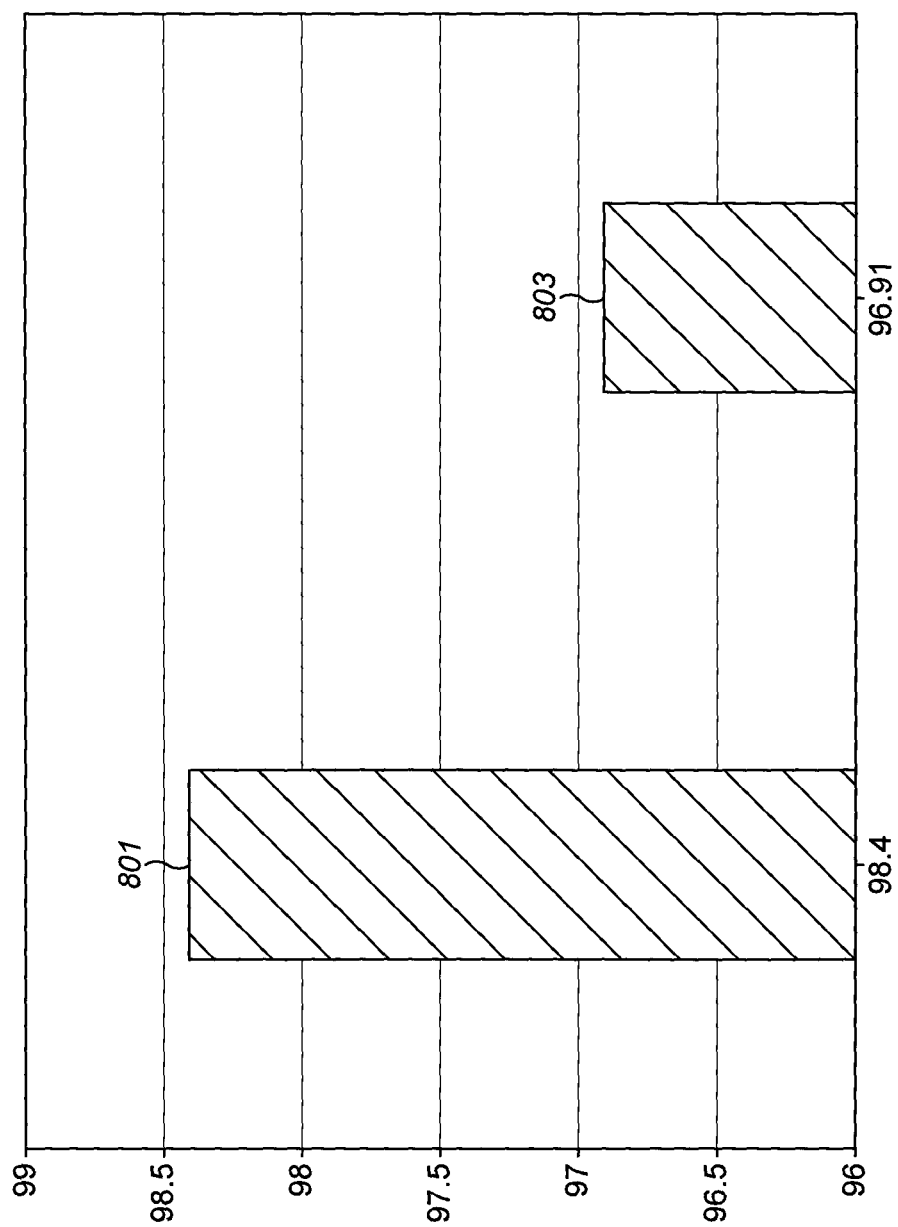
FIG. 9 shows an example measured loudness difference between speech and music audio tuning according to some embodiments.

FIG. 9 shows an example measured the total loudness output difference between a speech tuned loudness 801 and a standard or conventional tuning 803. In this example it is shown that the measured loudness difference is only 1.5 phon difference.

Figure 10:
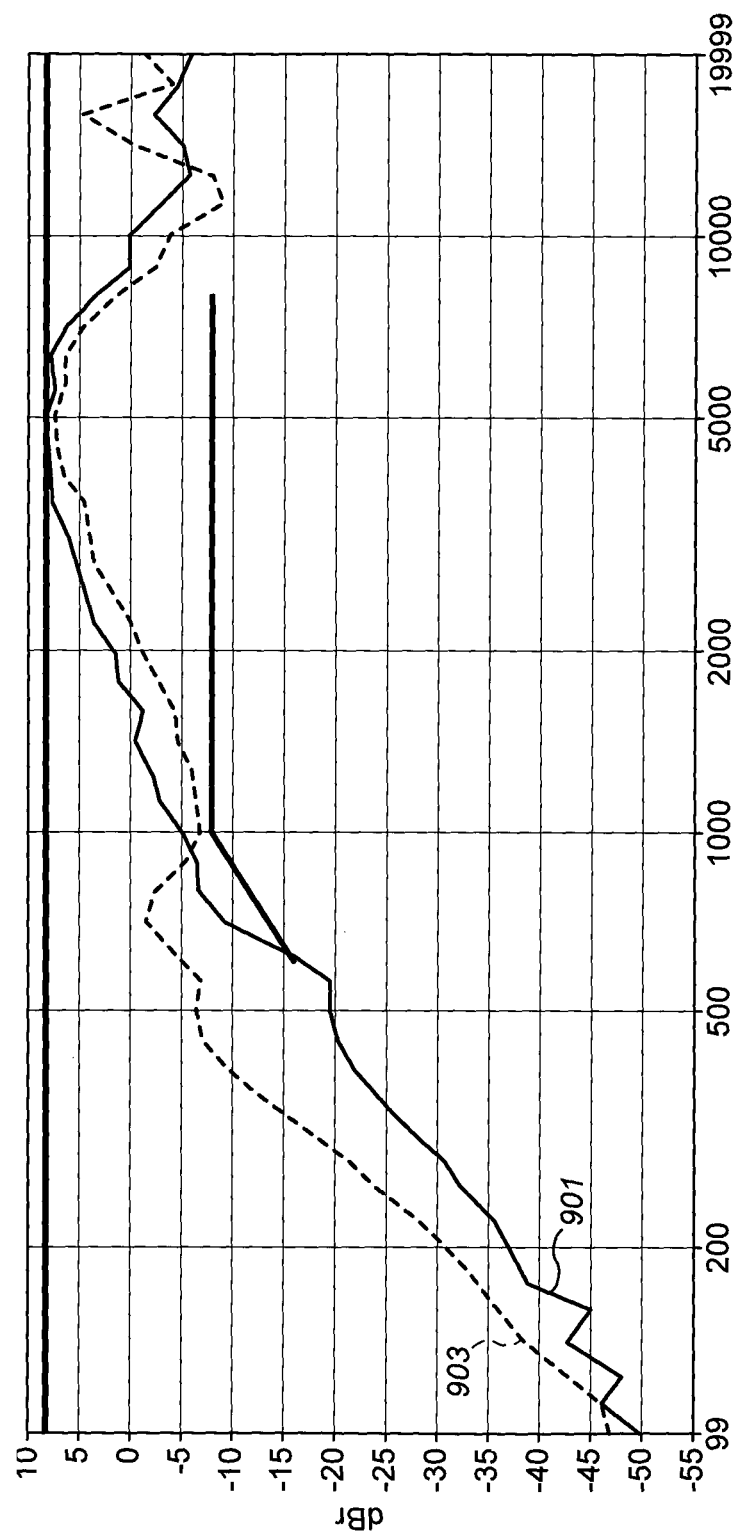
FIG. 10 shows an example measured frequency response for speech and standard tunings according to some embodiments.

With respect to FIG. 10 an example measured frequency response between the speech tuning and a conventional tuning is shown. With respect to FIG. 10 the frequency responses for speech tunings 903 and conventional tuning 901 is shown where there is much more energy for lower frequencies and the frequency response is flatter with speech tunings. The reason for this is that with speech there is much less energy on lower frequencies and it can be compressed more than music. Furthermore it would be understood that because the root mean squared (RMS) level of speech is smaller compared to the measurement signal used for the frequency response measurements the difference in real life is greater than that seen in FIG. 10.

It would be understood that in some embodiments the voice activity detector can be configured to determine an output such that where there is uncertainty the voice activity detector outputs a non-voice or non-speech result so that the detector does not determine music as being speech. This is because speech audio in the embodiments described herein attempts to achieve the best loudness by driving the speaker as hard as possible where speech audio is detected but avoid speaker damage as operating with speech DRC settings at full volume may produce distorted sound.

Although the above examples describe embodiments of the application operating within a codec within an apparatus 10, it would be appreciated that the invention as described below may be implemented as part of any audio (or speech) codec, including any variable rate/adaptive rate audio (or speech) codec. Thus, for example, embodiments of the application may be implemented in an audio codec which may implement audio coding over fixed or wired communication paths.

Thus user equipment may comprise an audio codec such as those described in embodiments of the application above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the application may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the application may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Thus at least some embodiments there may be an apparatus comprising at least one processor and at least one memory including computer program code the at least one memory and the computer program code configured to, with the at least one processor, cause the apparatus at least to perform: analysing an audio signal; signal processing the audio signal to enhance the speech component of the audio signal dependent on determining the audio signal comprises speech components; and signal processing the audio signal to enhance a loudness of the audio signal otherwise.

The embodiments of this application may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

Thus at least some embodiments there may be a computer-readable medium encoded with instructions that, when executed by a computer perform: analysing an audio signal comprises speech components; signal processing the audio signal to enhance the speech component of the audio signal dependent on determining the audio signal comprises speech components; and signal processing the audio signal to enhance the loudness of the audio signal otherwise The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the application may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:
(a) hardware-only circuit implementations (such as implementations in only analog and/or digital circuitry) and
(b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
(c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method comprising:
analyzing an audio signal to determine whether or not the audio signal is speech, wherein analyzing the audio signal comprises determining an indicator value in metadata identifying the audio signal as speech and determining voice activity in the audio signal;
signal processing the audio signal using a first one or more parameter to enhance a speech component of the audio signal dependent on determining the audio signal comprises the speech component, wherein signal processing the audio signal using the first one or more parameter to enhance the speech component of the audio signal comprises:
filtering the audio signal into at least two bands;
performing a dynamic range control processing on each of the at least two bands according to the first one or more parameter to generate dynamic range control bands, the first one or more parameter being a first set of dynamic range control settings so as to enhance an intelligibility of the speech of the audio signal; and
combining the dynamic range control processed bands into an audio signal to be output;
signal processing the audio signal using a second one or more parameter to enhance the audio signal dependent on determining the audio signal does not comprise the speech component; and
causing output of the processed audio signal to a loudspeaker or an audio playback transducer.

2. The method as claimed in claim 1, wherein performing the dynamic range control processing on the at least two bands comprises compressing a mid-band frequency range compared to the higher-band frequency range.

3. The method as claimed in claim 1, wherein signal processing the audio signal using the first one or more parameter to enhance the speech component of the audio signal comprises at least one of:
   equalizing the audio signal using the first one or more parameter to enhance an intelligibility of the speech component of the audio signal; and
   filtering the audio signal using the first one or more parameter to enhance an intelligibility of the speech component of the audio signal.

4. The method as claimed in claim 1, wherein signal processing the audio signal using the second one or more parameter to enhance the audio signal comprises at least one of:
   filtering the audio signal into at least two bands;
   performing a dynamic range control processing on the audio signal in at least two bands according to the second one or more parameter, the second one or more parameter being a second set of dynamic range control settings so as to enhance a loudness of the audio signal; and
   combining the dynamic range control processed bands into the audio signal to be output.

5. The method as claimed in claim 4, wherein performing the dynamic range control processing on the audio signal in at least two bands according to the second set of dynamic range control settings comprises compressing a higher-band frequency range compared to the mid-band frequency range.

6. The method as claimed in claim 1, wherein signal processing the audio signal using the second one or more parameter to enhance audio signal comprises at least one of:
   equalizing the audio signal using the second one or more parameter to enhance the loudness of the audio signal; and
   filtering the audio signal using the second one or more parameter to enhance the loudness of the audio signal.

7. The method as claimed in claim 2, wherein the mid-band frequency range is 700Hz and 4 kHz and the higher-band frequency range is greater than 4kHz.

8. An apparatus comprising at least one processor and at least one memory including computer code for one or more programs, the at least one memory and the computer code configured to with the at least one processor causes the apparatus to at least:
   analyze an audio signal to determine whether or not the audio signal is speech, wherein analyzing the audio signal comprises determining an indicator value in metadata identifying the audio signal as speech and determining voice activity in the audio signal;
   signal process the audio signal using a first one or more parameter to enhance a speech component of the audio signal dependent on determining the audio signal comprises the speech component, wherein the signal processed audio signal using the first one or more parameters to enhance the speech component of the audio signal causes the apparatus to:
      filter the audio signal into at least two bands;
      perform a dynamic range control processing on each the at least two bands according to the first one or more parameters to generate dynamic range control bands, the first one or more parameters being a first set of dynamic range control settings so as to enhance an intelligibility of the speech component of the audio signal; and
      combine the dynamic range control processed bands into an audio signal to be output;
   signal process the audio signal using a second one or more parameter to enhance the audio signal dependent on determining the audio signal does not comprise the speech component; and
   cause output of the processed audio signal to a loudspeaker or an audio playback transducer.

9. The apparatus as claimed in claim 8, wherein the dynamic range control processing causes the apparatus to compress a mid-band frequency range compared to the higher-band frequency range.

10. The apparatus as claimed in claim 8, wherein the signal processed audio signal using the second one or more parameter causes the apparatus to at least one of:
   filter the audio signal into at least two bands;
   perform a dynamic range control processing on the audio signal in at least two bands according to the second one or more parameter, the second one or more parameter being a second set of dynamic range control settings so to enhance a loudness of the audio signal; and
   combine the dynamic range control processed bands into the audio signal to be output.

11. The apparatus as claimed in claim 10, wherein the dynamic range control processing on the audio signal causes the apparatus to compress a higher-band frequency range compared to the mid-band frequency range.

12. A computer program product comprising at least one non-transitory computer-readable storage medium having computer-executable program code instructions stored therein, the computer-executable program code instructions including program code instructions for:
   analyzing an audio signal to determine whether or not the audio signal is speech, wherein analyzing the audio signal comprises determining an indicator value in metadata identifying the audio signal as speech and determining voice activity in the audio signal;
   processing the audio signal using a first one or more parameter to enhance a speech component of the audio signal dependent on determining the audio signal comprises the speech component, wherein processing the audio signal using the first one or more parameter to enhance the speech component of the audio signal comprises:
      filtering the audio signal into at least two bands;
      controlling each of the at least two bands according to the first one or more parameter to generate dynamic range control bands, the first one or more parameter being a first set of dynamic range control settings so as to enhance an intelligibility of the speech component of the audio signal; and
      combining the dynamic range control processed bands into an audio signal to be output;
   processing the audio signal using a second one or more parameter to enhance the audio signal dependent on determining the audio signal does not comprise the speech component; and
   causing output of the processed audio signal to a loudspeaker or an audio playback transducer.

13. The computer program product according to claim 12, including program code instructions for compressing a mid-band frequency range compared to a higher-band frequency range.

14. The computer program product according to claim 12, including program code instructions for:
   filtering the audio signal into at least two bands;
   controlling the audio signal in the at least two bands according to the second one or more parameter, the second one or more parameter being a second set of dynamic range control settings so to enhance an intelligibility of the speech component of the audio signal; and combining the dynamic range control processed bands into an output audio signal.

15. The computer program product according to claim 12, including program code instructions for:

equalizing the audio signal using the first one or more parameter to enhance an intelligibility of the speech component of the audio signal; and filtering the audio signal using the first one or more parameter to enhance an intelligibility of the speech component of the audio signal.

* * * * *